(12) United States Patent
Shyu et al.

(10) Patent No.: US 7,916,109 B2
(45) Date of Patent: Mar. 29, 2011

(54) PANEL FOR LIQUID CRYSTAL DISPLAY DEVICE

(75) Inventors: Wen-Yi Shyu, Tao Yuan Shien (TW); Chun-Chang Chiu, Tao Yuan Shien (TW); Liang-Neng Chien, Tao Yuan Shien (TW)

(73) Assignee: Au Optronics Corporation, Hsin-Chu (TW)

( * ) Notice: Subject to any disclaimer, the term of this patent is extended or adjusted under 35 U.S.C. 154(b) by 1212 days.

(21) Appl. No.: 11/541,695

(22) Filed: Oct. 3, 2006

(65) Prior Publication Data

US 2007/0075961 A1    Apr. 5, 2007

(30) Foreign Application Priority Data

Oct. 3, 2005  (TW) ............................... 94134483 A

(51) Int. Cl.
*G09G 3/36* (2006.01)

(52) U.S. Cl. .............................. 345/90; 349/54; 349/192

(58) Field of Classification Search ............ 345/87–100, 345/204; 349/187, 192, 54, 55, 18; 257/57, 257/59, 296, 315
See application file for complete search history.

(56) References Cited

U.S. PATENT DOCUMENTS

| 6,777,973 B2* | 8/2004 | Morishita | ........................ 349/37 |
| 2005/0184324 A1* | 8/2005 | Wu et al. | ........................ 257/296 |
| 2007/0165180 A1* | 7/2007 | Cho | .............................. 349/187 |

* cited by examiner

*Primary Examiner* — Regina Liang
(74) *Attorney, Agent, or Firm* — Bacon & Thomas, PLLC

(57) ABSTRACT

A panel of a liquid crystal display panel with a plurality of pixels is disclosed, wherein each pixel comprises one switch, one pixel electrode and one floating line. The switch comprises a gate, a source, and two drains. The pixel electrode can be electrically connected to the switch through the drain. Besides, each floating conductive line and two drains of the same switch are crossed but electrically disconnected. Hence, the design of the dual drain (or dual source) illustrated above and the combined the technique of laser welding can be used to repair the source-drain leakage of the substrate of the liquid crystal display device.

8 Claims, 4 Drawing Sheets

US 7,916,109 B2

PANEL FOR LIQUID CRYSTAL DISPLAY DEVICE

BACKGROUND OF THE INVENTION

1. Field of the Invention

The present invention relates to a panel or a substrate of a liquid crystal display device and, more particularly, to a panel or a substrate of an active matrix liquid crystal display device and the repairing method of the same.

2. Description of Related Art

The improvement of the yield of the process for manufacturing a panel of a liquid crystal display device (LCD) is very important. For improving the yield, it is necessary to repeatedly inspect in all the steps of the manufacturing process for screening out the unqualified products. However, particles exist inside and/or outside the apparatuses for manufacturing processes. The particles usually result in defects on the substrate for the liquid crystal display devices. For example, as a particle 90 falls on the surface of the switch 21 of the substrate 1 (see FIG. 1), the particle 90 results in shorting between the data line (source line) 35 and the drain 36. This shorting causes source-drain leakage and will further make the liquid crystal display device generate dark dots or bright dots (i.e. point defects) as the display device displays.

Since dumping the liquid crystal display device with point defects directly costs money, the manufacturers of LCD devices do many efforts on improving the manufacturing process and environment for manufacturing. For example, the LCD makers increase the frequency for cleaning the environment, enhancing the monitoring for the cleanness of the manufacturing environment, and improving the maintenance of the manufacturing apparatuses. On the other hand, the LCD manufacturers also develop method for repairing the LCD panel or the substrate of the LCD devices for saving costs. The yield can be improved effectively if the defected LCD device or the substrate of the LCD device can be well repaired. Of course, the cost can be reduced when the defected LCD device or the substrate of the LCD device can be well repaired.

The conventional method for repairing the defects on the LCD is shown in FIG. 1. A particle 90 falls on the surface of a switch (thin film transistor) 21 of a normally black liquid crystal display device and further results in a TFT defect such as source-drain leakage or TFT weak. When a voltage is applied on the LCD, a bright dot (i.e. a point defect) generates. The conventional method for repairing the defects illustrated above is achieved by welding the capacitor conductive lines 47 and the capacitor top lead 471 together and further cutting the drain 36, wherein the capacitor top lead 471 contact the pixel electrode 52 through contact holes 45, and the pixel electrode 52 electrically connected to the switch 21 through the drain 36. The cross of FIG. 1 marks 500 is the position of cutting. After repairing, the repaired pixel of the LCD acts as a permanent dark dots. Since human eyes are not sensitive to the dark dots, the consumer can also accept the LCDs with limited dark dots. Even though the tolerance value for the dark dots is higher than that of the bright dots, the permanent dark dots are not actually recovered through the conventional repairing method. In other words, the permanent dark dots are still abnormal pixels.

In addition, the defects caused by other factors decrease greatly since the process for manufacturing LCDs improves a lot in recent years. Hence, the point defects resulted from source-drain leakage become major defects relatively. Moreover, the tolerable requirement for the point defects becomes strict as the size of the LCD increases. Therefore, it is desirable to provide an improved method to mitigate the aforementioned problems of the source-drain leakage.

SUMMARY OF THE INVENTION

The present invention provides a panel of the liquid crystal display device. The substrate of the panel includes a plurality of pixels. Each pixel comprises: a switch, a pixel electrode, and a floating conductive line. The switch includes a gate, a source, and two drains. The pixel electrode is electrically connected to the switch by the assistance of the drain. The floating conductive line crosses the two drains without electrical connection. Hence, when source-drain leakage generates, the switch can be repaired by cutting the drains, and selectively welding the drain, and the floating conductive line. For example, when a particle falls on the location between the drain and the source, TFT source-drain leakage may happen because the short between the source and the drain generates.

Moreover, in the present invention, the source of the switch refers to the branch of the data line, which extends to overlap the switch. The source of the switch is connected to the data line.

In this kind of condition, the pixel with defects can be repaired into a normal pixel for displaying if the circuit of the defected pixel has the dual drain circuit of the pixel of the present invention. The repairing steps of the method of the present invention can be of following steps: (A) providing a substrate of a liquid crystal display device having a plurality of pixels, wherein each pixel includes: a switch having a gate, a source, and two drains; a pixel electrode; and a floating conductive line; wherein the pixel electrode electrically connects to the switch through the drain, and the floating conductive line crosses the two drains without electrical connection; (B) cutting one of the two drains, wherein the location of the cut on the drain is not between "the crossed position of the drain and the floating conductive line" and "the switch"; and (C) checking the pixel through charging the source and the gate on the substrate.

If the repaired pixel displays normally, the repairing is completed and can be stopped. In contrary, if the laser-repaired pixel doesn't display normally, it means that perhaps the particle falls on the uncut drain. In this situation, the defected pixel can be subsequently repaired by the following steps: (D) cutting the uncut drain, wherein the location of the cut on the conductive line is between "the crossed position of the drain and the floating conductive line" and "the switch"; and; (E) welding the two drains and the floating conductive line together to make the two drains electrically connected to the floating conductive line.

Hence, if the defect of a pixel is TFT source-drain leakage or TFT weak, the defect can be repaired through the laser-welding of the connection of dual drain and the floating conductive line design of the substrate of the present invention.

In addition, the present invention also provides a substrate having dual-source circuit in the TFT area. The substrate includes a plurality of pixels. Each pixel comprises: a switch, a pixel electrode, and a floating conductive line. The switch includes a gate, two sources, and a drain. The pixel electrode is electrically connected to the switch by the assistance of the drain. The floating conductive line crosses the two sources without electrical connection.

In this invention, the source refers to the branch of the data line, which extends to overlap the switch. The source of the switch is connected to the data line.

Likewise, the pixel with TFT source-drain leakage defect (or TFT weak) can be repaired into a normal pixel for displaying if the circuit of the defected pixel has the dual source circuit of the pixel of the present invention. The repairing steps of the method of the present invention can be a method of following steps: (A) providing a substrate of a liquid crystal display device having a plurality of pixels, wherein each pixel includes: a switch having a gate, a drain, and two sources; a pixel electrode; and a floating conductive line; wherein the pixel electrode electrically connects to the switch through the drain, and the floating conductive line crosses the two sources without electrical connection; (B) cutting one of the two source s, wherein the location of the cut on the source is not between "the crossed position of the source and the floating conductive line" and "the switch"; and (C) checking the pixel through charging the source and the gate on the substrate.

If the repaired pixel displays normally, the repairing is completed and can be stopped. In contrary, if the laser-repaired pixel doesn't display normally, it means that perhaps the particle falls on the uncut source. In this situation, the defected pixel can be subsequently repaired by the following steps: (D) cutting the uncut source, wherein the location of the cut on the source is between "the crossed position of the source and the floating conductive line" and "the switch"; and (E) welding the two sources and the floating conductive line together to make the two sources electrically connect to the floating conductive line.

The sources (or the drains) of the present invention can be cut with any cutting steps. Preferably, the sources (or the drains) are cut by laser. The laser of the present invention can be any laser. Preferably, the laser of the present invention is YAG laser, ruby laser, or $CO_2$ laser. The sources (or the drains) and the floating conductive line of the present invention can be welded with any laser. Preferably, the sources (or the drains) and the floating conductive line of the present invention are welded by YAG laser, ruby laser, or $CO_2$ laser.

In addition, each pixel of the substrate of the liquid crystal display device can further include a gate conductive line that is electrically connected to the gate. Each pixel of the substrate of the liquid crystal display device can optionally further include capacitor conductive line that is electrically connected to the drain, and the drain can be electrically connected to the pixel electrode through the capacitor conductive line, and the drain can electrically connected with the pixel electrode through the capacitor conductive line. The capacitor conductive line can be in any form. Preferably, the capacitor conductive line includes a top capacitor lead, and a bottom capacitor lead, wherein the top capacitor lead overlaps the bottom capacitor lead without electrical connection. In addition, the top capacitor lead can have at least one contact hole for electrically connecting the pixel electrode and the top capacitor lead. The pixel electrode of the substrate of the present invention can be made of any conductive material. Preferably, the pixel electrode of the substrate of the present invention is made of transparent conductive materials. More preferably, the pixel electrode is made of indium tin oxide or indium zirconium oxide (IZO). The floating conductive line can be made of any conductive material. Preferably, the floating conductive line and the gate conductive line are made of the same material.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
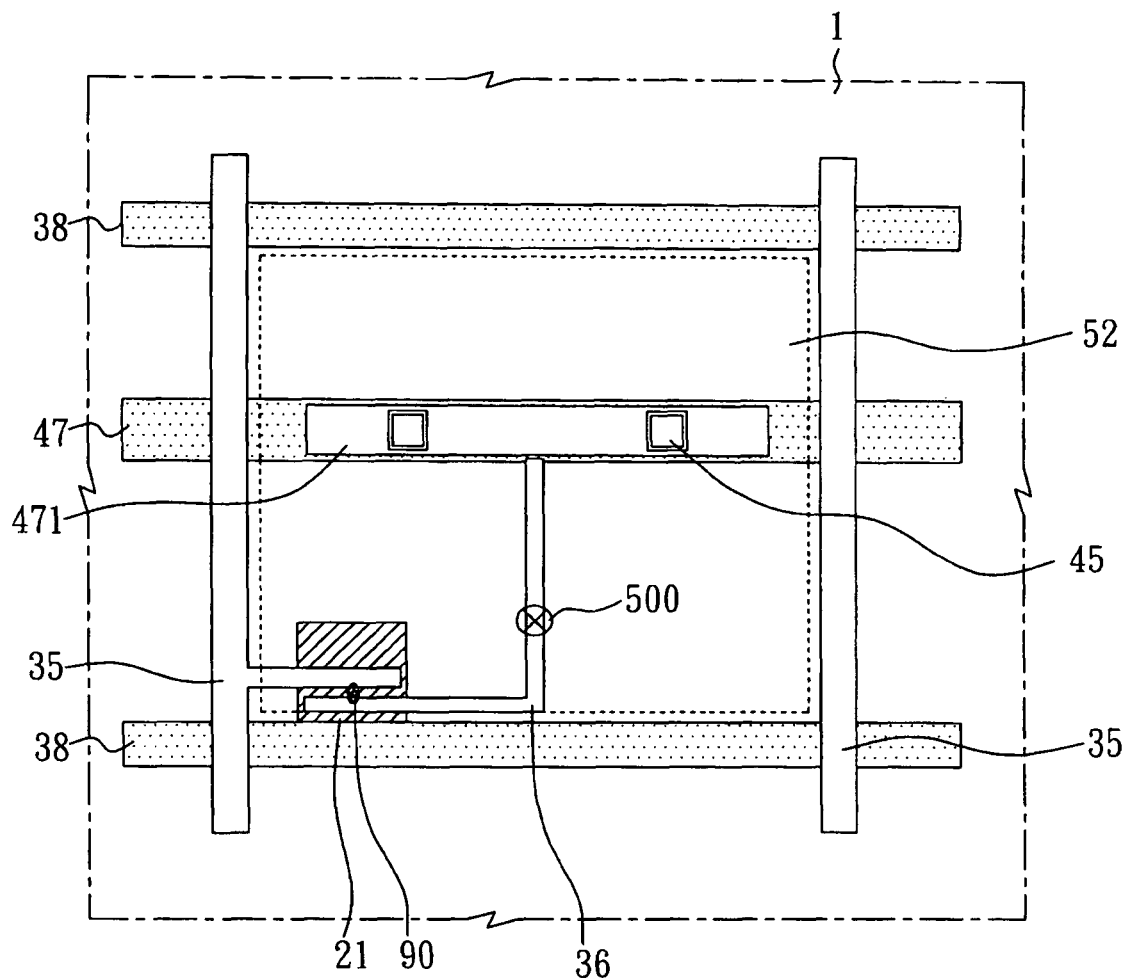
FIG. 1 is a top view of the TFT switch of the substrate of a prior art.
Figure 2:
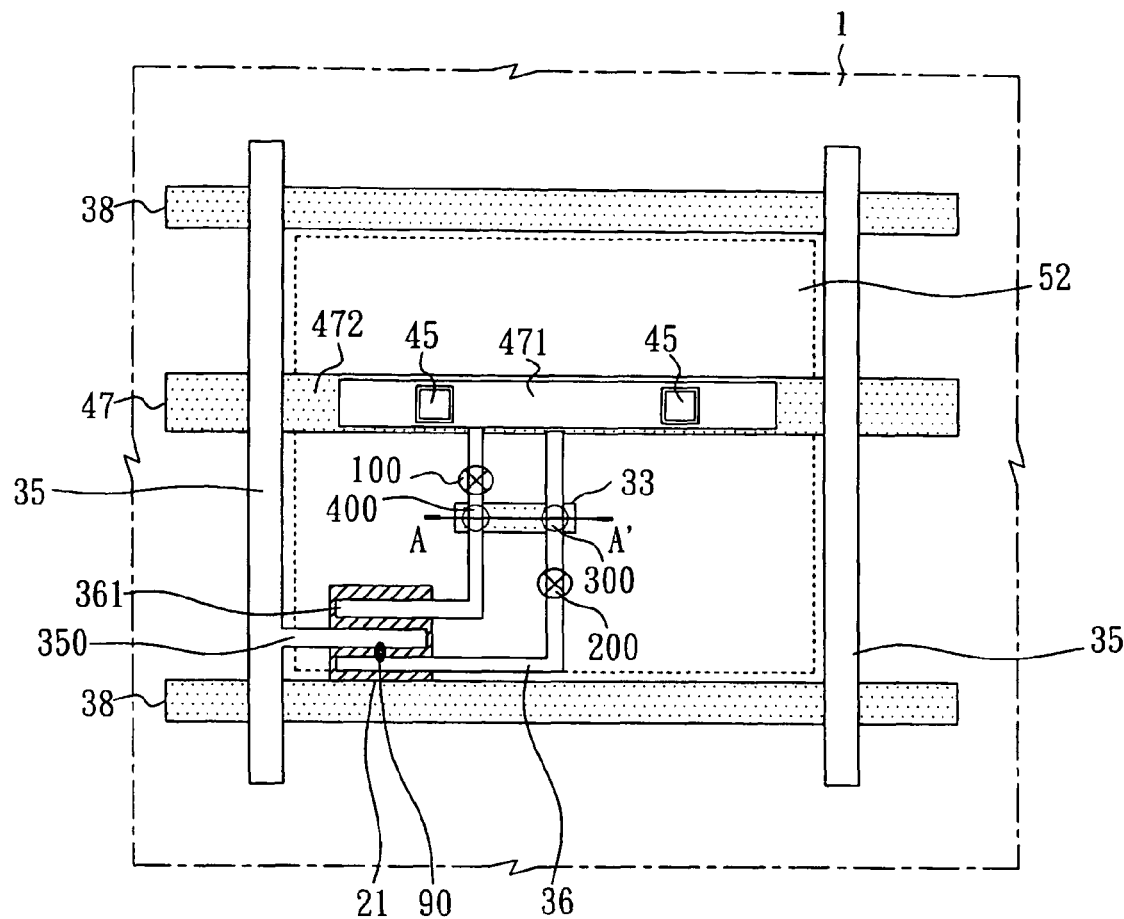
FIG. 2 is a top view of the TFT switch of the substrate of the first embodiment of the present invention.
Figure 3:
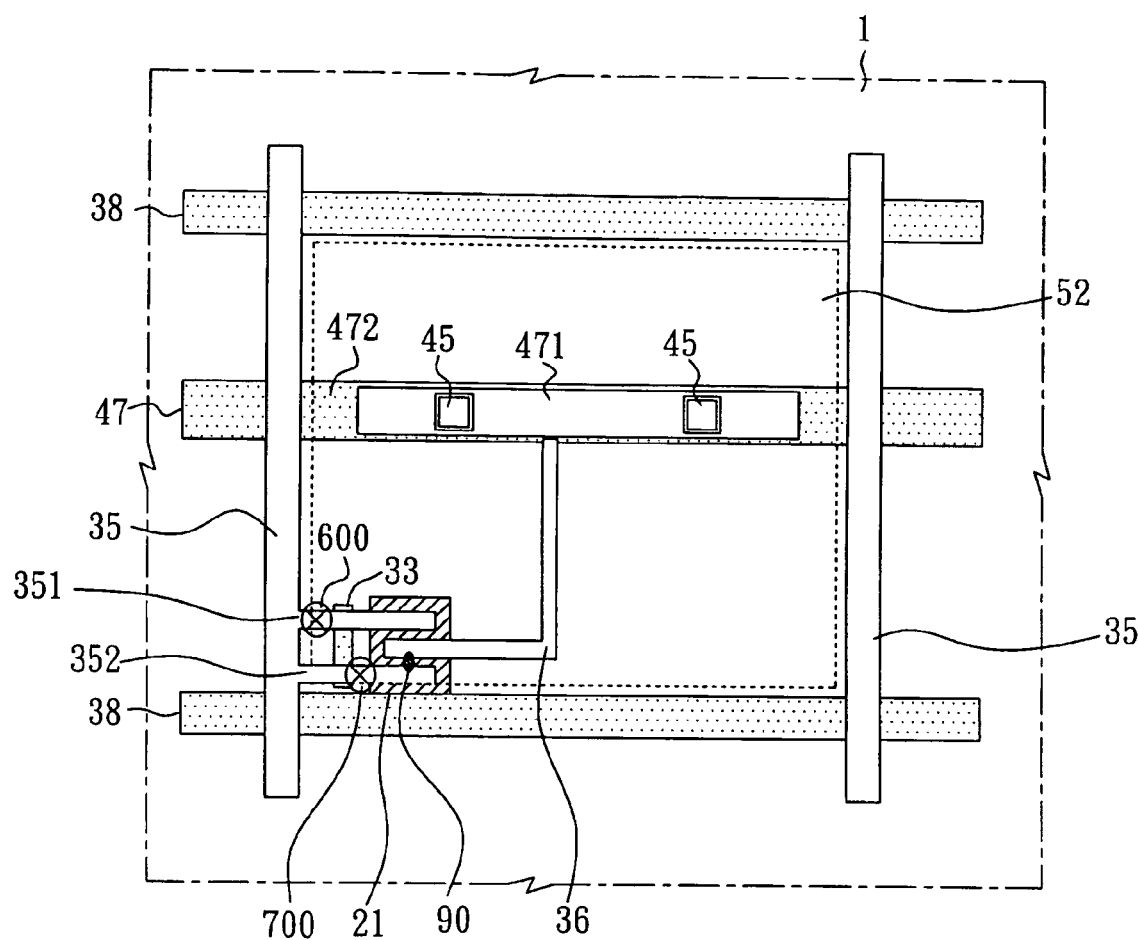
FIG. 3 is a top view of the TFT switch of the substrate of the embodiments of the present invention.

FIG. 2 and FIG. 3 are the top view of the TFT switch of the substrate of a LCD panel in the embodiments of the present invention. By way of repairing the structure of the circuit in the TFT area of the substrate of a LCD panel, the LCD panel with source-drain leakage can be repaired and transferred into a normal LCD panel.

Embodiment 1

A top view of the TFT switch of the substrate of a panel in the present embodiment of the present invention is shown in FIG. 2. The substrate 1 of the present embodiment comprises a plurality of pixels. Each pixel has a pixel electrode 52, a gate conductive line 38, a capacitor conductive line 47, a data line (source line) 35, a floating conductive line 33, and a switch 21.

The switch of the present invention can be a thin film transistor. In the present embodiment, the switch 21 is a filed-effect transistor (FET). The switch 21 of the present embodiment includes a gate (not shown), a source 350, and two drains 36, 361 for providing high charging rate to the LCD, especially the large-sized LCD.

The LCD of the present embodiment is a normally black LCD. In other words, the LCD of the present embodiment display dark as no voltage is applied thereon. As shown in FIG. 2, the source 350 is a branch of the data line 35, and is extended to overlap the switch 21. The data lines 35 perpendicularly cross the gate conductive lines 38 without electrical connection. A dielectric layer (not shown in figures) is located between the data lines 35 and gate conductive lines 38 for preventing electrical contact. Moreover, capacitor conductive lines 47 are located between the locations of the two gate conductive lines 38. Preferably, the capacitor conductive lines 47 are parallel to the gate conductive lines 38 to avoid electrical contact with the gate conductive lines 38. Furthermore, the capacitor conductive lines 47 also cross the data lines 35 without electrical connection. Similarly, a dielectric layer (not shown in the figures) is arranged between the capacitor conductive lines 47 and the data lines 35 to avoid electrical contact there between.

The data lines 35 are electrically connected to the electric power sources (not shown) and the source 350. The gate conductive lines 38 are electrically connected to the electric power sources (not shown) and the gate of the switch 21. Through these connections, the source 350 and the gate conductive lines 38 can provide enough voltage to drive the switch 21 when the LCD displays. In addition, the drains 36, 361 are electrically connected to the capacitor conductive lines 47 and the drain of the switch 21. Owing to the circuit of the drains 36, 361, and the capacitor conductive lines 47, the applied voltage can be passed to the capacitor conductive lines 47 and the pixel electrode 52. Hence, the pixel electrode 52 can be electrically connected with the switch 21 by way of the drain 36, 361. Furthermore, part of the capacitor conductive lines 47 is made of top capacitor lead 471 and bottom capacitor lead 472. A dielectric layer is arranged between the top capacitor lead 471 and bottom capacitor lead 472. The top capacitor lead 471, the dielectric layer, and the bottom capacitor lead 472 form a storage capacitor for a pixel. The drain 36, 361 can be electrically connected to the top capacitor lead 471 or the bottom capacitor lead 472. In the present embodiment, the drains 36, 361 are electrically connected to the top capacitor lead 471. In addition, two contact holes 45 are made on each capacitor conductive line 47 to contact the pixel electrode 52.

The repairing method of the substrate of the present embodiment can be illustrated following. As a particle 90 falls on the surface of the location of the source 350 and the drain 36, the source 350 and the drain 36 short by way of the particle 90 (i.e. the source-drain leakage). Therefore, the pixel electrode 52 corresponding to the abnormally charged switch 21 displays a bright dot on the screen.

Figure 4:
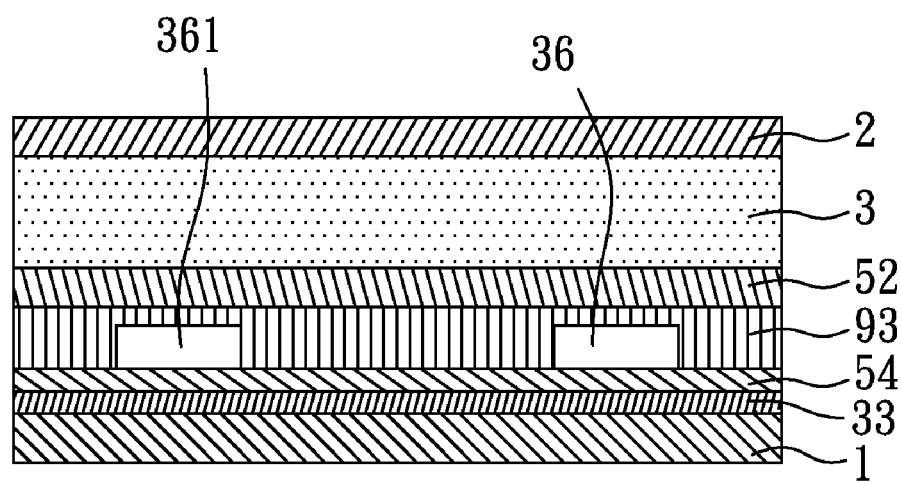
FIG. 4 is a cross section view of AA' dash line in FIG. 2

The following explanation is referred to FIG. 2 and FIG. 4. As shown in FIG. 2, the switch 21 of the present embodiment has two drains 36, 361. The floating conductive line 33 crosses the drains 36, 361 without electrical connection. FIG. 4 is a cross-section view of the AA' line. On the surface of the substrate 1 (the glass substrate), there are floating conductive line 33, two drains 36, 361, and a dielectric layer 54 (see FIG. 4). Since the dielectric layer 54 is located between the floating conductive line 33 and the drains 36, 361, the floating conductive line 33 and the drains 36, 361 are not electrically connected. In addition, there is a flatting layer 93 covered the drains 36, 361. Furthermore, a pixel electrode 52 is located on the flatting layer 93 and covers the flatting layer 93. The substrate 1 and another opposite substrate 2 are assembled to form a panel of a liquid crystal display device when liquid crystal 3 is injected.

It is hard to observe the position of the particle fallen on the surface of the substrate after the panel is assembled. However, the defect caused by the source-drain leakage on the LCD of the present embodiment can be repaired through the following steps: (1) First, one of the two drains 36, 361 is cut by laser. The cutting position on the drains 36, 361 cannot be arranged between "the crossed position of the drains 36, 361 and the floating conductive line 33" and "the switch 21". In the present embodiment, the drain 361 is cut first and the position of cutting is marked as a cross 100. (2) The panel is applied with a voltage for checking. If the bright dot recovers normal display condition after the laser cut illustrated above is done, the repairing is achieved. In contrary, if the bright dot does not recover to normal condition for display, it means that the particle 90 perhaps falls on the other uncut drain line 36. In the present embodiment, the laser-processed pixel of the LCD still displays a bright dot when the voltage is applied. (3) The uncut drain 36 is then cut by laser. The position of the cut is located on the drain 36 between "the crossed position of the drain 36 and the floating conductive line 33" and "the switch 21". In the present embodiment, the drain 36 is cut second and the position of cutting is marked as a cross 200. (4) The floating conductive line 33 and drains 36, 361 are welded through a laser to make the floating conductive line 33, and drains 36, 361 electrically connected. In the present embodiment, the circles 300, 400 mark the locations of the laser welding. Through the laser welding illustrated above, the electrically opened drains 36, 361 can be transferred as a new draine by the assistance of the floating conductive line 33. Besides, the new drain is electrically insulated from the particle 90. The pixel electrode 52 can be electrically connected to the switch 21 through the new drain. Of course, the pixel electrode 52 displays normally after the repairing is finished.

Embodiment 2

FIG. 3 is a top view of another embodiment of the present invention. In the present embodiment, the switch 21 of each pixel of the substrate of the liquid crystal display device includes a gate (not shown), a drain 36, and two sources 351, 352. The sources 351, 352 of the switch 21 are electrically connected to the data line 35. Besides, the sources 351, 352 are the branches of the data line 35, and are extended to overlap the switch 21. The floating conductive line 33 crosses the two sources 351, 352 without electrical connection. The other part of the pixel of the present embodiment is the same as that of the embodiment 1 illustrated above.

Similarly, the repairing of the source-drain leakage of the pixel of the panel of the liquid crystal display device is achieved by cutting sources and laser welding. As shown in FIG. 3, assuming the source 351 of a pixel of an assembled LCD panel is short, the source 351 is cut on the position marked cross 600 to make the source 351 electrically disconnected. The repaired panel is then applied with a voltage for testing. If the pixel proceeded with laser cutting is still a bright dot, it means that the repairing is not finished yet. In other words, the particle perhaps falls around the other source 352. The source 352 is then cut with laser. The location of the laser cut on the source 352 is marked by a cross 700. Finally, the two sources 351, 352, and the floating conductive line 33 are electrically connected by laser welding. In other words, a laser-welding-repaired electrical path or a new source forms. The pixel electrode 52 can be electrically connected to the switch 21 through the new source.

The laser used in the present invention can be any laser. In the present embodiment, the laser is YAG laser, ruby laser, or $CO_2$ laser. The wavelength and the power of the laser can be adjusted according to the real demand for the sources or drains treated by laser cutting or laser welding.

Although the present invention has been explained in relation to its preferred embodiment, it is to be understood that many other possible modifications and variations can be made without departing from the spirit and scope of the invention as hereinafter claimed.

What is claimed is:

1. A method for repairing a pixel of a liquid crystal display device, comprising following steps:
    (A) providing a substrate having a plurality of pixels thereon, wherein each pixel comprises: a switch having a gate, a source and two drains; a pixel electrode; and a floating conductive line; the pixel electrode electrically connects to the switch through the drain, and the floating conductive line crosses the two drains without electrical connection;
    (B) cutting one of the two drains, wherein the location of the cut on the drain is not between the crossed position of the drain and the floating conductive line and the switch; and
    (C) checking the pixel through charging the source and the gate on the substrate;
    (D) cutting the uncut drain, wherein the location of the cut on the conductive line is between the crossed position of the drain and the floating conductive line and the switch; and
    (E) welding the two drains and the floating conductive line together to make the two drains electrically connect to the floating conductive line.

2. The method of claim 1, wherein the drain is cut by YAG laser, ruby laser, or CO2 laser.

3. The method of claim 1, wherein the drain is cut by YAG laser, ruby laser, or CO2 laser.

4. The method of claim 1, wherein the two drains and the floating conductive line are welded by YAG laser, ruby laser, or CO2 laser.

5. A method for repairing a pixel of a liquid crystal display device, comprising following steps:
   (A) providing a substrate having a plurality of pixels thereon, wherein each pixel comprises: a switch having a gate, a drain and two sources; a pixel electrode; and a floating conductive line; the pixel electrode electrically connects to the switch through the drain, and the floating conductive line crosses with the two sources without electrical connection;
   (B) cutting one of the two sources, wherein the location of the cut on the source is not between the crossed position of the source and the floating conductive line and the switch; and
   (C) checking the pixel through charging the source and the gate on the substrate;
   (D) cutting the uncut source, wherein the location of the cut on the source is between the crossed position of the source and the floating conductive line and the switch; and
   (E) welding the two sources and the floating conductive line together to make the two sources electrically connect to the floating conductive line.

6. The method of claim 5, wherein the source is cut by YAG laser, ruby laser, or CO2 laser.

7. The method of claim 5, wherein the source is cut by YAG laser, ruby laser, or CO2 laser.

8. The method of claim 5, wherein the two sources and the floating conductive line are welded by YAG laser, ruby laser, or CO2 laser.

* * * * *